United States Patent
Smart et al.

(10) Patent No.: US 6,852,365 B2
(45) Date of Patent: Feb. 8, 2005

(54) SILICON PENETRATION DEVICE WITH INCREASED FRACTURE TOUGHNESS AND METHOD OF FABRICATION

(75) Inventors: Wilson Smart, Palo Alto, CA (US); Kumar Subramanian, Pleasanton, CA (US); Eugene Orloff, Berkeley, CA (US)

(73) Assignee: Kumetrix, Inc., Union City, CA (US)

( * ) Notice: Subject to any disclaimer, the term of this patent is extended or adjusted under 35 U.S.C. 154(b) by 0 days.

(21) Appl. No.: 10/459,967

(22) Filed: Jun. 12, 2003

(65) Prior Publication Data

US 2004/0038045 A1 Feb. 26, 2004

Related U.S. Application Data

(62) Division of application No. 09/816,470, filed on Mar. 26, 2001, now abandoned.

(51) Int. Cl.[7] .............................. B05D 3/02; C23F 1/00
(52) U.S. Cl. .................... 427/309; 427/314; 427/398.1; 216/2; 216/99
(58) Field of Search ................................ 427/299, 314, 427/315, 398.1, 307, 309; 216/2, 99

(56) References Cited

U.S. PATENT DOCUMENTS

| | | | | |
|---|---|---|---|---|
| 3,628,983 A | * | 12/1971 | Leger et al. | 428/81 |
| 4,985,368 A | * | 1/1991 | Ishii et al. | 438/248 |
| 5,238,871 A | * | 8/1993 | Sato | 438/474 |
| 6,066,265 A | * | 5/2000 | Galvin et al. | 216/2 |
| 6,139,759 A | * | 10/2000 | Doezema et al. | 216/11 |

* cited by examiner

Primary Examiner—Stephen Stein

(57) ABSTRACT

A silicon penetration device with increased fracture toughness and method of fabrication thereof are provided. The method comprises strengthening silicon penetration devices by thermally growing a silicon oxide layer on the penetration device and then subsequently stripping the silicon oxide. The method also includes strengthening silicon penetration devices through the sputtering of thin film coatings on the silicon penetration devices.

20 Claims, 1 Drawing Sheet

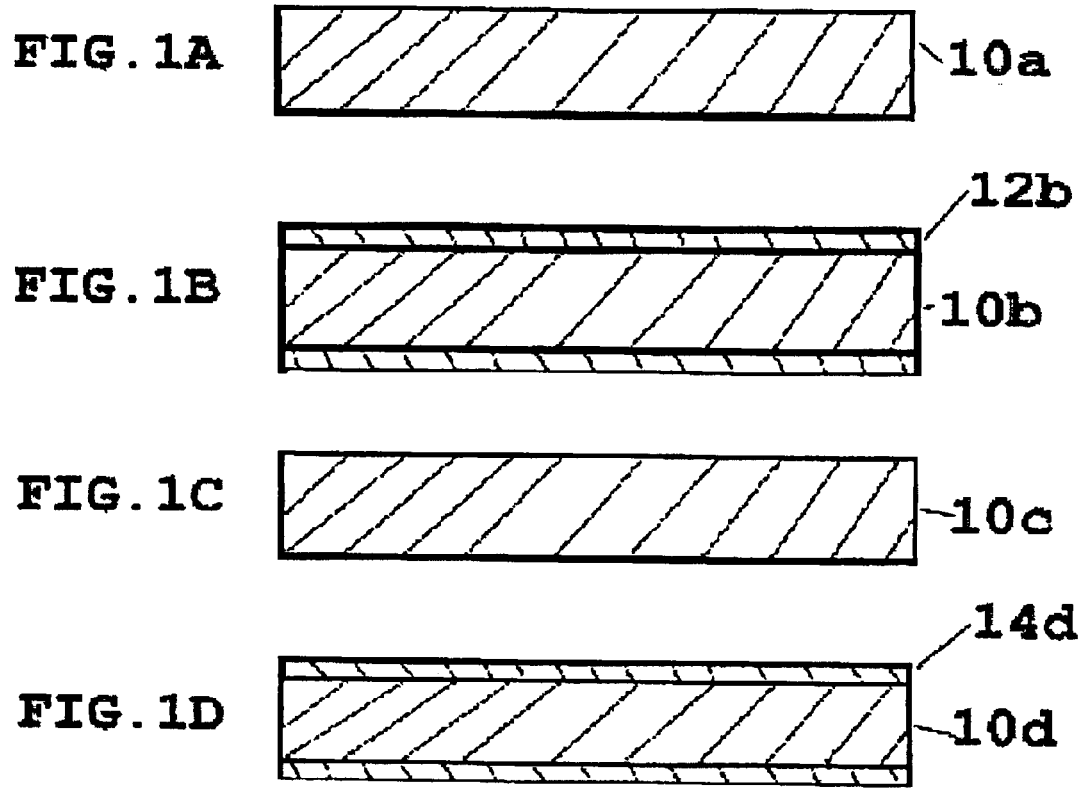

SILICON PENETRATION DEVICE WITH INCREASED FRACTURE TOUGHNESS AND METHOD OF FABRICATION

This application is a divisional application of U.S. patent application Ser. No. 09/816,470, file Mar. 26, 2001, now abandoned.

TECHNICAL FIELD

This invention relates generally to a method for strengthening silicon penetration devices such as needles or probes by increasing fracture toughness.

BACKGROUND

It is well known in the art that silicon is a brittle substance. A penetration device constructed from single crystal silicon must possess a certain degree of mechanical robustness in order to ensure successful use of the needle without accidental fracture of the needle in patients. The device may have an interior channel (a hollow penetration device through which fluids can pass for sampling or injection) or it may be solid (for use as a lancet or probe). Integrated circuit and MEMS (microelectromechanical systems) technologies are used to fabricate these silicon penetration devices. Common MEMS fabrication methods, such as bulk etching with potassium hydroxide solution, leave the surface of the penetration device in a roughened state, with resultant increase in surface flaws. The actual failure of the silicon penetration device is the result of microcrack propagation initiated at a flaw on the surface of the material. It is important therefore, to increase the fracture toughness of the penetration device to permit reliable skin penetration without breakage.

In Kim et al, U.S. Statutory Invention Registration H001166, a tightly adherent thermally grown silicon containing oxide layer was utilized in order to limit the strength diminishing effects of microflaws located on the surface of the substrate. The materials applied are a composition of matter comprising silicon-based ceramics. In Kim, the material was exposed to an environment of essentially hydrogen and water vapor at the correct temperature and pressure for a predetermined amount of time thereby forming the oxide layer.

In Leger et al, U.S. Pat. No. 3,628,983, thin film coatings were applied to vitreous and vitrocrystalline (derived from or consisting of glass) bodies. Chemical modifications were made to the coatings of Leger while the coatings were in a heated condition with the film and substrate being subsequently cooled to create compressive stresses in the films. The chemical modifications varied between a step involving the oxidation of a metal or a metal compound, and the replacement of alkali metal ions in the coating by ions which derived from the medium and which conferred on the coating a lower coefficient of thermal expansion. Creating a compressive stress on the surface of the substrate provides a means of holding together surface defects which otherwise limit the strength of the material.

In Ishi et al, U.S. Pat. No. 4,985,368, the substrate of a semiconductor was strengthened by depositing oxide over a corner of the device. The substrate consisted of a main surface, a predetermined impurity concentration of a first conductivity type, and a trench with a sufficient radius of curvature over at least a bottom corner portion thereof. A two-layer film consisting of oxide and nitride was formed on the main surface of the substrate, the side portions of the trench and a portion of the bottom of the trench. A second, selective, oxide layer was formed on the bottom and at the corner portion of the trench. The selective oxide layer spanned the corner portion of the trench with a radius of curvature more than $\frac{1}{10}$ and less than $\frac{1}{2}$ of the width of the trench.

The above prior art teaches the application of oxide to produce a compressive film intended to reduce microcrack propagation. In no case was the film subsequently removed, providing the substantial increase in fracture toughness shown in our present invention.

In Leger, an external thin film coating was applied to a material in an attempt to minimize the effects of surface flaws. However, Leger did not use nickel as one of the thin films. Furthermore, the materials that are being strengthened are vitreous and vitrocrystalline bodies. Also, the methods of Leger involve creating compressive stresses in the films through both chemical treating at an elevated temperature and subsequent cooling.

In Wilson et al "Fracture Testing of Bulk Silicon Microcantilever Beams Subjected to a Side Load" silicon microcantilevers were fracture tested experimentally. However, the silicon microcantilevers of the Wilson experiment did not undergo surface modifications. Furthermore, in Wilson, the strengthening of devices through surface modifications was not addressed.

While the prior art devices exemplify existing methods, there still exists a need for improved methods for strengthening silicon penetration devices by increasing fracture toughness.

SUMMARY

It is an object of the present invention, therefore, to provide a strengthened silicon penetration device with increased fracture toughness and method for fabrication thereof. The penetration device or probe of such a device is approximately the thickness of a human hair, much smaller than a metal needle or lancet, yet can penetrate skin reliably and virtually painlessly Another object of the present invention is to strengthen silicon penetration devices by thermally growing a silicon oxide layer on the penetration device or probe from the bulk silicon material thereof and subsequently stripping the silicon oxide therefrom.

Yet another object of the present invention is to strengthen penetration devices through the sputtering of thin film coatings on the silicon penetration device or probe.

Another object of the present invention is to provide silicon penetration devices on which a silicon oxide layer was thermally grown from the bulk silicon material of the device substrate and then subsequently removed, resulting in an increase in fracture toughness.

Still another object of the present invention is to provide silicon penetration devices which are coated with a one (1) micrometer nickel film, resulting in an increase in fracture toughness.

Another object of the present invention is to provide a method of increasing fracture toughness that does not require a film in a compressed state in the finished product.

To achieve the foregoing and other objects and in accordance with the purpose of the present invention as embodied and broadly described herein, the present invention is directed to a penetration device with increased fracture toughness and method for its construction.

BRIEF DESCRIPTION OF THE DRAWINGS

FIG. 1A is a sectional side view illustrating an unprocessed silicon penetration device 10a, that is, the device prior to applying the methods of the present invention;

FIG. 1B is a sectional side view illustrating a silicon penetration device 10b after formation of a silicon oxide layer 12b on the top and bottom surfaces thereof;

FIG. 1C is a sectional side view illustrating a silicon penetration device 10c after removal of the silicon oxide layer 12c to expose the smoothed silicon surface; and FIG. 1D is a sectional side view illustrating a silicon penetration device 10d having a nickel film 14d deposited thereon.

The first two digits of each reference number in the above figures indicate related elements. The third digit indicates the figure in which an element is shown.

DETAILED DESCRIPTION OF THE PREFERRED EMBODIMENTS

The present invention comprises methods of increasing the fracture toughness of silicon penetration devices. The first method comprises two steps. In the first step, the silicon surface of the device substrate is reacted at elevated temperatures with gaseous materials to form a thick adherent silicon-containing chemical film, for example a silicon oxide or oxynitride, on the silicon substrate surface. In the second step, the chemically-bound silicon film is removed by etching.

FIG. 1A shows a side sectional view of silicon substrate 10a of a previously unprocessed penetration device, that is, a device prior to applying the methods of this invention. The penetration device silicon has been fabricated using standard integrated circuit (IC) and microelectromechanical systems (MEMS) processing technologies, probably including wet etching.

As illustrated in FIG. 1B, an embodiment of the present invention includes a method for strengthening silicon penetration devices by thermally growing a silicon oxide layer 12b on silicon penetration device substrate 10b, and subsequently stripping the silicon oxide layer 12b from substrate 10b. The resultant silicon substrate 10c, which has a freshly exposed silicon surface, is illustrated in FIG. 1C. As illustrated in FIG. 1D, the present invention further includes strengthening penetration devices through the sputtering of thin film coating 14d on the silicon substrate 10d.

The first step is the thermal growing of a thin layer of silicon oxide 12b on the surface of the silicon substrate 10a by oxidizing the bulk silicon of the substrate surface. The second step is the subsequent removal of silicon oxide layer 12b in a buffered oxide etch. Each of these two processing steps results in penetration devices which exhibit an increase in the critical strength values (that is, the maximum bending force and maximum critical force) over the unprocessed device, as can be seen in TABLE 1.

TABLE 1

Maximum bending stress and maximum critical force for silicon penetration device with an "average" 94 micrometer thick penetration device or probe

| Condition | Maximum Bending Force, σ$_{bend}$ (MegaPascal, MPa) | Maximum Critical Force (Newton, N) |
| --- | --- | --- |
| Polished silicon wafer reference | 1227 | 0.251 |
| Unprocessed penetration device (roughened surface from KOH micromachining etch) | 455 | 0.093 |
| Penetration device with ~1 micrometer thermal silicon oxide surface coating (1100° C.) | 665 | 0.136 |
| Penetration device with oxide removed via BOE etch | 2024 | 0.414 |

The maximum bending stress and maximum critical force values for the penetration device with an "average" 94 micrometer thick penetration device or probe after various steps of the present invention are provided in TABLE 1. These values provide a measure of the fracture toughness of the penetration device, with higher values indicating increased toughness. Standard MEMS fabrication techniques to produce silicon penetration devices include micromachining the silicon wafer with wet etchants such as potassium hydroxide solution. Prior to such treatment, a silicon penetration device with the initial reference surface of the polished silicon wafer has a maximum bending stress of 1227 Mpa and a maximum critical force of 0.251 N. After standard micromachining with a potassium hydroxide solution etch, the maximum bending stress decreases to 455 Mpa and the maximum critical force decreases to 0.093 N. This etching process increases surface roughness, producing a corresponding increase in surface defects where microcracks can initiate and thus decrease the fracture toughness of the penetration device.

The two-step method of the present invention has several advantages over the prior art. For instance, in the first step, when thermally growing silicon oxide layer 12b from the surface of silicon substrate 10a, silicon oxide layer 12b actually becomes the outer surface of the needle or probe. This outer surface is smoother than the original roughened surface of substrate 10a, with the interface between silicon oxide layer 12b and substrate 10b possibly also becoming more smooth during the oxide formation process. When silicon oxide layer 12b is then removed, the resultant penetration device exhibits a significant increase in fracture toughness in comparison to the unprocessed device.

The two processing steps of the present invention will now be described. In step one, silicon oxide layer 12b is grown at elevated temperatures on the surface of silicon substrate 10a. The silicon substrate 10a itself serves as the source of silicon in the reaction to form silicon oxide layer 12b, the outer surface of substrate 10b. Silicon has a significantly greater coefficient of thermal expansion than does silicon oxide. Thus, when silicon oxide layer 12b is formed at an elevated temperature and silicon microprobe device subsequently cooled to room temperature, silicon substrate 10b undergoes a greater contraction than does silicon oxide layer 12b. This places silicon oxide layer 12b in a state of compression, thereby tending to hold the microflaws together and inhibiting failure. Further, photomicrographs of the oxide surface indicate that it is visibly smoother than the surface of unprocessed substrate 10a. Referring to TABLE 1, the values of the maximum bending stress and maximum critical force for a penetration device with silicon oxide layer 12b of the present invention are greater than those for unprocessed precursor silicon penetration device 10a, which had been micromachined using a wet KOH (potassium hydroxide) etch.

In the second step of the present invention, silicon oxide layer 12b is removed from substrate 10b thereby revealing the newly-exposed silicon surface of substrate 10c. Again referring to TABLE 1, the values of the maximum bending stress and maximum critical force for a device with substrate 10c surface characteristics are a factor of 3.04 greater than those for a device comprising silicon substrate 10b and silicon oxide layer 12b and, most unexpectedly, 1.65 greater than those for the polished silicon wafer reference device. The reasons for this unexpected increase in fracture toughness are not known. Two possible postulates may contribute to the observed increase.

a. In step 1, when silicon oxide layer 12b is grown on substrate 10a at elevated temperatures, annealing may possibly occur at the interface between silicon oxide layer 12b and the single crystal silicon substrate, creating a smoother silicon boundary. Therefore, when silicon oxide layer 12b is removed from substrate 10b in step 2, the newly uncovered surface of substrate 10c is smoother with fewer defects
   b. A layer of polycrystalline silicon may possibly recrystallize at the silicon oxide/silicon interface during the elevated temperature processing. The polycrystalline silicon layer exposed when the oxide layer is removed may contribute to a decrease in surface roughness. Further, polycrystalline silicon has a higher fracture toughness than single crystal silicon.

In sum, a preferred embodiment of the present invention comprises the following processing steps:
   1. The unprocessed penetration device is RCA cleaned. RCA clean is a standard semiconductor cleaning process using two solutions in sequence. The first is an aqueous solution of ammonia and hydrogen peroxide; the second an aqueous solution of hydrochloric acid and hydrogen peroxide.
   2. The RCA-cleaned device is placed in a Tylan oxide furnace and the temperature is increased to 1100 degrees Celsius.
   3. The penetration device is exposed to a dry oxygen environment for five (5) minutes;
   4. A wet steam is introduced into the furnace for a variable predetermined time resulting in silicon oxide layer 12b growth on substrate 10b of approximately forty (40) Angstroms per minute;
   5. The dry oxygen environment is reintroduced into the furnace;
   6. The penetration device is removed from the furnace having approximately one (1) micrometer of silicon oxide layer 12b growth on the top and bottom surfaces of substrate 10a; and
   7. The penetration device is placed in a buffered oxide etchant for approximately thirty (30) minutes, removing the thermally grown oxide layer, and exposing the smoothened surface of the penetration device 16 of the present invention. The buffered oxide etchant solution comprises water, ammonium fluoride, hydrofluoric acid, and ammonium hydrogen fluoride.

The present invention further includes strengthening the penetration device by depositing a 0.5 micrometer to 1.0 micrometer thick nickel film layer 14d onto both sides of substrate 10a. Preferably, the nickel film layer 14d is deposited on substrate 10a through a sputtering technique. The presence of the nickel film layer 14d on substrate 10d reduces the effects of the strength limiting flaws on the surface of the silicon penetration device 10d by sealing and covering the defects thereon, thus inhibiting microcrack propagation and increasing fracture toughness.

The methods of the present invention with the nickel film layer 14d comprise the following steps:
   1. The penetration device is cleaned by submersing them into methylene chloride ($CH_2Cl_2$) for approximately ten (10) minutes; and
   2. A nickel film layer 14d having a thickness of one (1) micrometer is sputtered onto both sides of substrate 10d at a power of approximately five-hundred (500) watts and at a rate of approximately four hundred and ninety-five (495) Angstroms per minute.

The resultant silicon penetration device with nickel film layer 14d exhibits significantly greater fracture toughness than the device with KOH etched substrate 10a. The value of the maximum bending stress for the device with nickel film layer 14d is a factor of 1.19 greater than that for the device with substrate 10a alone.

INDUSTRIAL APPLICABILITY

It will be apparent to those skilled in the are that the objects of this invention have been achieved as described hereinbefore by providing a silicon penetration device with increased fracture toughness and method of fabrication thereof. The method comprises strengthening silicon penetration devices by thermally growing a chemically-bound silicon-containing layer on the penetration device and then subsequently stripping off the layer. The method also includes strengthening silicon penetration devices through the sputtering of thin film coatings on the silicon penetration devices. The resultant penetration devices exhibit increased fracture toughness and are capable of penetrating skin reliably and painlessly without breakage. They are useful for a wide range of blood monitoring and sampling applications.

CONCLUSION

The foregoing description of the preferred embodiments of the subject invention have been presented for purposes of illustration and description and for a better understanding of the invention. Various changes may be made in the embodiments presented herein without departing from the concept of the invention. For example, other chemicals capable of reacting with the silicon of the unprocessed penetration device 10a to form a thick adherent film can be added together, individually, or in sequence during the film formation steps. Therefore, the scope of the invention is to be determined by the terminology of the following claims and the legal equivalents thereof.

We claim:
1. A method of forming a silicon penetration device having increased fracture toughness, the method comprising:

processing a silicon substrate to form the silicon penetrating device;
   cleaning a surface of the silicon penetration device;
   heating the cleaned silicon penetration device;
   exposing the silicon penetration device to a reactive environment at elevated temperature to form an adherent film on the surface of the penetration device, the reactive environment containing one or more of the following reactants at one time, or in a sequence: oxygen, ozone, steam, hydrogen, ammonia, nitrous oxide, nitric oxide, nitrogen;

cooling the silicon penetration device; and etching the silicon penetration device to remove at least a part of the adherent film.

2. The method of claim 1 wherein, during the cleaning step, the silicon penetration device is RCA cleaned.

3. The method of claim 1 wherein the heating step is accomplished by a Tylan oxide furnace.

4. The method of claim 1 wherein during the heating step the temperature of the device is raised to 1100 degrees Celsius.

5. The method of claim 1 wherein the cooling step begins when the silicon penetration device has approximately one (1) micrometer of film has grown on the surface of the silicon substrate.

6. The method of claim 1 wherein during the etching step the silicon penetration device is placed in a 6:1 solution of water and hydrofluoric acid.

7. The method of claim 1 wherein during the etching step the silicon penetration device is placed in a buffered oxide etchant (BOE) for approximately thirty (30) minutes such that the thermally grown surface layer is removed and the smoothened surface of the silicon substrate is exposed.

8. A method of making a silicon penetration device having an increased fracture toughness, comprising the steps of:

providing a silicon substrate for the silicon penetration device, having an initial surface;

processing the initial surface as a result of which the initial surface is roughened;

heating the silicon substrate to an elevated temperature;

exposing the heated silicon substrate to a series of one or more sequential reactive environments, each containing one or more reactants selected from the group consisting of oxygen, ozone, steam, hydrogen, ammonia, nitrous oxide, nitric oxide and nitrogen;

growing an adherent film of a silicon compound on the roughened initial surface of the silicon substrate during the exposing step, the adherent film formed by a chemical reaction between the reactant or reactants and silicon from the silicon substrate underlying the growing adherent film;

cooling the silicon substrate with the adherent film; and removing at least a part of the adherent film from the underlying silicon to uncover a new surface on the silicon substrate;

to provide the silicon penetration device having increased fracture toughness.

9. The method of claim 8, wherein the new substrate surface is smoother than the roughened initial substrate surface for providing the increased fracture toughness of the silicon penetration device.

10. The method of claim 8, further comprising, before the growing step, the additional step of cleaning the surface of the silicon substrate to receive the adherent film.

11. The method of claim 8, wherein during the exposing step, the heated silicon substrate is simultaneously exposed to multiple selected reactants.

12. The method of claim 8, wherein during the exposing step, the heated silicon substrate is serially exposed to multiple selected reactants.

13. The method of claim 8, wherein the growing step is terminated when the adherent film has grown to a thickness of about one micrometer.

14. The method of claim 8, wherein during the removing step, the adherent film is completely removed to uncover a new surface on the silicon substrate.

15. The method of claim 8, wherein the adherent film is a silicon oxide compound.

16. A method of making a silicon penetration device having an increased fracture toughness, comprising the steps of:

providing a silicon substrate for the silicon penetration device, having an initial surface;

processing the initial surface as a result of which the initial surface is roughened;

heating the silicon substrate to an elevated temperature;

exposing the heated silicon substrate to a series of one or more reactive environments containing the reactant or reactants oxygen, steam, or a mixture thereof;

growing an adherent film of a silicon oxide compound on the roughened initial surface of the silicon substrate during the exposing step, the adherent film formed by a reaction between the reactant or reactants and silicon from the silicon substrate underlying the growing adherent film;

cooling the silicon substrate with the adherent film; and etching away at least a part of the adherent film from the underlying silicon to uncover a new surface on the silicon substrate;

to provide the silicon penetration device having increased fracture toughness.

17. The method of claim 16, wherein the exposing step further comprises the steps of:

exposing the heated silicon substrate to a reactive environment containing dry oxygen reactant;

exposing the exposed silicon substrate to wet steam reactant; and exposing the exposed silicon substrate to dry oxygen reactant.

18. The method of claim 16, wherein during the exposing step, the silicon substrate is exposed to dry oxygen for about five minutes.

19. The method of claim 16, wherein during growing step, the reactive environment supports an adherent film growth rate of about forty Angstroms per minute.

20. The method of claim 16, wherein during the etching step, the adherent film is completely etched away to uncover a new surface on the silicon substrate.

* * * * *